United States Patent
Kim et al.

(10) Patent No.: US 7,202,554 B1
(45) Date of Patent: Apr. 10, 2007

(54) SEMICONDUCTOR PACKAGE AND ITS MANUFACTURING METHOD

(75) Inventors: Do Hyung Kim, Jungnang-gu (KR); Hyung Il Jeon, Jungnang-gu (KR); Doo Hyun Park, Seongdong-gu (KR)

(73) Assignee: Amkor Technology, Inc., Chandler, AZ (US)

( * ) Notice: Subject to any disclaimer, the term of this patent is extended or adjusted under 35 U.S.C. 154(b) by 7 days.

(21) Appl. No.: 10/921,642

(22) Filed: Aug. 19, 2004

(51) Int. Cl.
*H01L 23/02* (2006.01)

(52) U.S. Cl. ................................. 257/686; 257/777

(58) Field of Classification Search ................ 257/686, 257/666, 777, 723, 724, 676, 787
See application file for complete search history.

(56) References Cited

U.S. PATENT DOCUMENTS

| | | | |
|---|---|---|---|
| 2,596,993 A | 5/1952 | Gookin | |
| 3,435,815 A | 4/1969 | Forcier | |
| 3,734,660 A | 5/1973 | Davies et al. | |
| 3,838,984 A | 10/1974 | Crane et al. | |
| 4,054,238 A | 10/1977 | Lloyd et al. | |
| 4,189,342 A | 2/1980 | Kock | |
| 4,258,381 A | 3/1981 | Inaba | |
| 4,289,922 A | 9/1981 | Devlin | |
| 4,301,464 A | 11/1981 | Otsuki et al. | |
| 4,332,537 A | 6/1982 | Slepcevic | |
| 4,417,266 A | 11/1983 | Grabbe | |
| 4,451,224 A | 5/1984 | Harding | |
| 4,530,152 A | 7/1985 | Roche et al. | |
| 4,541,003 A | 9/1985 | Otsuka et al. | |
| 4,646,710 A | 3/1987 | Schmid et al. | |
| 4,707,724 A | 11/1987 | Suzuki et al. | |
| 4,727,633 A | 3/1988 | Herrick | |
| 4,737,839 A | 4/1988 | Burt | |
| 4,756,080 A | 7/1988 | Thorp, Jr. et al. | |
| 4,812,896 A | 3/1989 | Rothgery et al. | |
| 4,862,245 A | 8/1989 | Pashby et al. | |
| 4,862,246 A | 8/1989 | Masuda et al. | |
| 4,907,067 A | 3/1990 | Derryberry | |
| 4,920,074 A | 4/1990 | Shimizu et al. | |
| 4,935,803 A | 6/1990 | Kalfus et al. | |
| 4,942,454 A | 7/1990 | Mori et al. | |
| 4,987,475 A | 1/1991 | Schlesinger et al. | |
| 5,018,003 A | 5/1991 | Yasunaga | |
| 5,029,386 A | 7/1991 | Chao et al. | |
| 5,041,902 A | 8/1991 | McShane | |

(Continued)

FOREIGN PATENT DOCUMENTS

DE 19734794 A1 8/1997

(Continued)

*Primary Examiner*—S. V. Clark
(74) *Attorney, Agent, or Firm*—Stetina Brunda Garred & Brucker

(57) ABSTRACT

A semiconductor package comprising paddle and a plurality of leads which extend at least partially about the die paddle in spaced relation thereto. Attached to the die paddle is a semiconductor die which is electrically connected to at least some of the leads. Attached to the semiconductor die is at least one inner package. A package body encapsulates the die paddle, the leads, the semiconductor die and the inner package such that a portion of each of the leads and a portion of the inner package are exposed in the package body.

19 Claims, 12 Drawing Sheets

U.S. PATENT DOCUMENTS

| | | |
|---|---|---|
| 5,057,900 A | 10/1991 | Yamazaki |
| 5,059,379 A | 10/1991 | Tsutsumi et al. |
| 5,065,223 A | 11/1991 | Matsuki et al. |
| 5,070,039 A | 12/1991 | Johnson et al. |
| 5,087,961 A | 2/1992 | Long et al. |
| 5,091,341 A | 2/1992 | Asada et al. |
| 5,096,852 A | 3/1992 | Hobson |
| 5,118,298 A | 6/1992 | Murphy |
| 5,122,860 A | 6/1992 | Kichuchi et al. |
| 5,134,773 A | 8/1992 | LeMaire et al. |
| 5,151,039 A | 9/1992 | Murphy |
| 5,157,475 A | 10/1992 | Yamaguchi |
| 5,157,480 A | 10/1992 | McShane et al. |
| 5,168,368 A | 12/1992 | Gow, III et al. |
| 5,172,213 A | 12/1992 | Zimmerman |
| 5,172,214 A | 12/1992 | Casto |
| 5,175,060 A | 12/1992 | Enomoto et al. |
| 5,200,362 A | 4/1993 | Lin et al. |
| 5,200,809 A | 4/1993 | Kwon |
| 5,214,845 A | 6/1993 | King et al. |
| 5,216,278 A | 6/1993 | Lin et al. |
| 5,218,231 A | 6/1993 | Kudo |
| 5,221,642 A | 6/1993 | Burns |
| 5,250,841 A | 10/1993 | Sloan et al. |
| 5,252,853 A | 10/1993 | Michii |
| 5,258,094 A | 11/1993 | Furui et al. |
| 5,266,834 A | 11/1993 | Nishi et al. |
| 5,273,938 A | 12/1993 | Lin et al. |
| 5,277,972 A | 1/1994 | Sakumoto et al. |
| 5,278,446 A | 1/1994 | Nagaraj et al. |
| 5,279,029 A | 1/1994 | Burns |
| 5,281,849 A | 1/1994 | Singh Deo et al. |
| 5,294,897 A | 3/1994 | Notani et al. |
| 5,327,008 A | 7/1994 | Djennas et al. |
| 5,332,864 A | 7/1994 | Liang et al. |
| 5,335,771 A | 8/1994 | Murphy |
| 5,336,931 A | 8/1994 | Juskey et al. |
| 5,343,076 A | 8/1994 | Katayama et al. |
| 5,358,905 A | 10/1994 | Chiu |
| 5,365,106 A | 11/1994 | Watanabe |
| 5,381,042 A | 1/1995 | Lerner et al. |
| 5,391,439 A | 2/1995 | Tomita et al. |
| 5,406,124 A | 4/1995 | Morita et al. |
| 5,410,180 A | 4/1995 | Fujii et al. |
| 5,414,299 A | 5/1995 | Wang et al. |
| 5,417,905 A | 5/1995 | LeMaire et al. |
| 5,424,576 A | 6/1995 | Djennas et al. |
| 5,428,248 A | 6/1995 | Cha |
| 5,435,057 A | 7/1995 | Bindra et al. |
| 5,444,301 A | 8/1995 | Song et al. |
| 5,452,511 A | 9/1995 | Chang |
| 5,454,905 A | 10/1995 | Fogelson |
| 5,474,958 A | 12/1995 | Djennas et al. |
| 5,484,274 A | 1/1996 | Neu |
| 5,493,151 A | 2/1996 | Asada et al. |
| 5,498,902 A * | 3/1996 | Hara .......................... 257/686 |
| 5,508,556 A | 4/1996 | Lin |
| 5,517,056 A | 5/1996 | Bigler et al. |
| 5,521,429 A | 5/1996 | Aono et al. |
| 5,528,076 A | 6/1996 | Pavio |
| 5,530,292 A * | 6/1996 | Waki et al. ................. 257/724 |
| 5,534,467 A | 7/1996 | Rostoker |
| 5,539,251 A | 7/1996 | Iverson et al. |
| 5,543,657 A | 8/1996 | Diffenderfer et al. |
| 5,544,412 A | 8/1996 | Romero et al. |
| 5,545,923 A | 8/1996 | Barber |
| 5,581,122 A | 12/1996 | Chao et al. |
| 5,592,019 A | 1/1997 | Ueda et al. |
| 5,592,025 A | 1/1997 | Clark et al. |
| 5,594,274 A | 1/1997 | Suetaki |
| 5,595,934 A | 1/1997 | Kim |
| 5,604,376 A | 2/1997 | Hamburgen et al. |
| 5,608,265 A | 3/1997 | Kitano et al. |
| 5,608,267 A | 3/1997 | Mahulikar et al. |
| 5,625,222 A | 4/1997 | Yoneda et al. |
| 5,633,528 A | 5/1997 | Abbott et al. |
| 5,639,990 A | 6/1997 | Nishihara et al. |
| 5,640,047 A | 6/1997 | Nakashima |
| 5,641,997 A | 6/1997 | Ohta et al. |
| 5,643,433 A | 7/1997 | Fukase et al. |
| 5,644,169 A | 7/1997 | Chun |
| 5,646,831 A | 7/1997 | Manteghi |
| 5,650,663 A | 7/1997 | Parthasaranthi |
| 5,661,088 A | 8/1997 | Tessier et al. |
| 5,665,996 A | 9/1997 | Williams et al. |
| 5,673,479 A | 10/1997 | Hawthorne |
| 5,683,806 A | 11/1997 | Sakumoto et al. |
| 5,689,135 A | 11/1997 | Ball |
| 5,696,666 A | 12/1997 | Miles et al. |
| 5,701,034 A | 12/1997 | Marrs |
| 5,703,407 A | 12/1997 | Hori |
| 5,710,064 A | 1/1998 | Song et al. |
| 5,723,899 A | 3/1998 | Shin |
| 5,724,233 A | 3/1998 | Honda et al. |
| 5,726,493 A | 3/1998 | Yamashita |
| 5,736,432 A | 4/1998 | Mackessy |
| 5,745,984 A | 5/1998 | Cole, Jr. et al. |
| 5,753,532 A | 5/1998 | Sim |
| 5,753,977 A | 5/1998 | Kusaka et al. |
| 5,766,972 A | 6/1998 | Takahashi et al. |
| 5,770,888 A | 6/1998 | Song et al. |
| 5,776,798 A | 7/1998 | Quan et al. |
| 5,783,861 A | 7/1998 | Son |
| 5,801,440 A | 9/1998 | Chu et al. |
| 5,814,877 A | 9/1998 | Diffenderfer et al. |
| 5,814,881 A | 9/1998 | Alagaratnam et al. |
| 5,814,883 A | 9/1998 | Sawai et al. |
| 5,814,884 A | 9/1998 | Davis et al. |
| 5,817,540 A | 10/1998 | Wark |
| 5,818,105 A | 10/1998 | Kouda |
| 5,821,457 A | 10/1998 | Mosley et al. |
| 5,821,615 A | 10/1998 | Lee |
| 5,834,830 A | 11/1998 | Cho |
| 5,835,988 A | 11/1998 | Ishii |
| 5,844,306 A | 12/1998 | Fujita et al. |
| 5,856,911 A | 1/1999 | Riley |
| 5,859,471 A | 1/1999 | Kuraishi et al. |
| 5,866,939 A | 2/1999 | Shin et al. |
| 5,871,782 A | 2/1999 | Choi |
| 5,874,784 A | 2/1999 | Aoki et al. |
| 5,877,043 A | 3/1999 | Alcoe et al. |
| 5,886,397 A | 3/1999 | Ewer |
| 5,886,398 A | 3/1999 | Low et al. |
| 5,894,108 A | 4/1999 | Mostafazadeh et al. |
| 5,897,339 A | 4/1999 | Song et al. |
| 5,900,676 A | 5/1999 | Kweon et al. |
| 5,903,049 A | 5/1999 | Mori |
| 5,903,050 A | 5/1999 | Thurairajaratnam et al. |
| 5,909,053 A | 6/1999 | Fukase et al. |
| 5,915,998 A | 6/1999 | Stidham et al. |
| 5,917,242 A | 6/1999 | Ball |
| 5,939,779 A | 8/1999 | Kim |
| 5,942,794 A | 8/1999 | Okumura et al. |
| 5,951,305 A | 9/1999 | Haba |
| 5,959,356 A | 9/1999 | Oh |
| 5,969,426 A | 10/1999 | Baba et al. |
| 5,973,388 A | 10/1999 | Chew et al. |
| 5,976,912 A | 11/1999 | Fukutomi et al. |
| 5,977,613 A | 11/1999 | Takata et al. |
| 5,977,615 A | 11/1999 | Yamaguchi et al. |
| 5,977,630 A | 11/1999 | Woodworth et al. |
| 5,981,314 A | 11/1999 | Glenn et al. |
| 5,986,333 A | 11/1999 | Nakamura |
| 5,986,885 A | 11/1999 | Wyland |

| | | |
|---|---|---|
| 6,001,671 A | 12/1999 | Fjelstad |
| 6,013,947 A | 1/2000 | Lim |
| 6,018,189 A | 1/2000 | Mizuno |
| 6,020,625 A | 2/2000 | Qin et al. |
| 6,025,640 A | 2/2000 | Yagi et al. |
| 6,031,279 A | 2/2000 | Lenz |
| RE36,613 E | 3/2000 | Ball |
| 6,034,423 A | 3/2000 | Mostafazadeh et al. |
| 6,040,626 A | 3/2000 | Cheah et al. |
| 6,043,430 A | 3/2000 | Chun |
| 6,060,768 A | 5/2000 | Hayashida et al. |
| 6,060,769 A | 5/2000 | Wark |
| 6,072,228 A | 6/2000 | Hinkle et al. |
| 6,075,284 A | 6/2000 | Choi et al. |
| 6,081,029 A | 6/2000 | Yamaguchi |
| 6,084,310 A | 7/2000 | Mizuno et al. |
| 6,087,715 A | 7/2000 | Sawada et al. |
| 6,087,722 A | 7/2000 | Lee et al. |
| 6,100,594 A | 8/2000 | Fukui et al. |
| 6,113,473 A | 9/2000 | Costantini et al. |
| 6,114,752 A | 9/2000 | Huang et al. |
| 6,118,174 A | 9/2000 | Kim |
| 6,118,184 A | 9/2000 | Ishio et al. |
| RE36,907 E | 10/2000 | Templeton, Jr. et al. |
| 6,130,115 A | 10/2000 | Okumura et al. |
| 6,130,473 A | 10/2000 | Mostafazadeh et al. |
| 6,133,623 A | 10/2000 | Otsuki et al. |
| 6,140,154 A | 10/2000 | Hinkle et al. |
| 6,143,981 A | 11/2000 | Glenn |
| 6,169,329 B1 | 1/2001 | Farnworth et al. |
| 6,177,718 B1 | 1/2001 | Kozono |
| 6,181,002 B1 | 1/2001 | Juso et al. |
| 6,184,465 B1 | 2/2001 | Corisis |
| 6,184,573 B1 | 2/2001 | Pu |
| 6,190,944 B1 * | 2/2001 | Choi .................. 438/109 |
| 6,194,777 B1 | 2/2001 | Abbott et al. |
| 6,197,615 B1 | 3/2001 | Song et al. |
| 6,198,171 B1 | 3/2001 | Huang et al. |
| 6,201,186 B1 | 3/2001 | Daniels et al. |
| 6,201,292 B1 | 3/2001 | Yagi et al. |
| 6,204,554 B1 | 3/2001 | Ewer et al. |
| 6,208,020 B1 | 3/2001 | Minamio et al. |
| 6,208,021 B1 | 3/2001 | Ohuchi et al. |
| 6,208,023 B1 | 3/2001 | Nakayama et al. |
| 6,211,462 B1 | 4/2001 | Carter, Jr. et al. |
| 6,218,731 B1 | 4/2001 | Huang et al. |
| 6,222,258 B1 | 4/2001 | Asano et al. |
| 6,222,259 B1 | 4/2001 | Park et al. |
| 6,225,146 B1 | 5/2001 | Yamaguchi et al. |
| 6,229,200 B1 | 5/2001 | Mclellan et al. |
| 6,229,205 B1 | 5/2001 | Jeong et al. |
| 6,239,366 B1 * | 5/2001 | Hsuan et al. ........... 174/52.3 |
| 6,239,367 B1 * | 5/2001 | Hsuan et al. ........... 174/52.4 |
| 6,239,384 B1 | 5/2001 | Smith et al. |
| 6,242,281 B1 | 6/2001 | Mclellan et al. |
| 6,256,200 B1 | 7/2001 | Lam et al. |
| 6,258,629 B1 | 7/2001 | Niones et al. |
| 6,281,566 B1 | 8/2001 | Magni |
| 6,281,568 B1 | 8/2001 | Glenn et al. |
| 6,282,095 B1 | 8/2001 | Houghton et al. |
| 6,285,075 B1 | 9/2001 | Combs et al. |
| 6,291,271 B1 | 9/2001 | Lee et al. |
| 6,291,273 B1 | 9/2001 | Miyaki et al. |
| 6,294,100 B1 | 9/2001 | Fan et al. |
| 6,294,830 B1 | 9/2001 | Fjelstad |
| 6,295,977 B1 | 10/2001 | Ripper et al. |
| 6,297,548 B1 | 10/2001 | Moden et al. |
| 6,303,981 B1 * | 10/2001 | Moden .................. 257/666 |
| 6,303,984 B1 | 10/2001 | Corisis |
| 6,303,997 B1 | 10/2001 | Lee |
| 6,307,272 B1 | 10/2001 | Takahashi et al. |
| 6,309,909 B1 | 10/2001 | Ohgiyama |
| 6,316,822 B1 | 11/2001 | Venkateshwaran et al. |
| 6,316,838 B1 | 11/2001 | Ozawa et al. |
| 6,323,550 B1 | 11/2001 | Martin et al. |
| 6,326,243 B1 | 12/2001 | Suzuya et al. |
| 6,326,244 B1 | 12/2001 | Brooks et al. |
| 6,326,678 B1 | 12/2001 | Karnezos et al. |
| 6,335,564 B1 | 1/2002 | Pour |
| 6,337,510 B1 | 1/2002 | Chun-Jen et al. |
| 6,339,255 B1 | 1/2002 | Shin |
| 6,348,726 B1 | 2/2002 | Bayan et al. |
| 6,355,502 B1 | 3/2002 | Kang et al. |
| 6,369,447 B2 | 4/2002 | Mori |
| 6,369,454 B1 | 4/2002 | Chung |
| 6,373,127 B1 | 4/2002 | Baudouin et al. |
| 6,380,048 B1 | 4/2002 | Boon et al. |
| 6,384,472 B1 | 5/2002 | Huang |
| 6,388,336 B1 | 5/2002 | Venkateshwaran et al. |
| 6,395,578 B1 | 5/2002 | Shin et al. |
| 6,400,004 B1 | 6/2002 | Fan et al. |
| 6,410,979 B2 | 6/2002 | Abe |
| 6,414,385 B1 | 7/2002 | Huang et al. |
| 6,420,779 B1 | 7/2002 | Sharma et al. |
| 6,429,508 B1 | 8/2002 | Gang |
| 6,437,429 B1 | 8/2002 | Su et al. |
| 6,444,499 B1 | 9/2002 | Swiss et al. |
| 6,448,633 B1 | 9/2002 | Yee et al. |
| 6,452,279 B2 | 9/2002 | Shimoda |
| 6,459,148 B1 | 10/2002 | Chun-Jen et al. |
| 6,464,121 B2 | 10/2002 | Reijnders |
| 6,476,469 B2 | 11/2002 | Huang et al. |
| 6,476,474 B1 | 11/2002 | Hung |
| 6,482,680 B1 | 11/2002 | Khor et al. |
| 6,498,099 B1 | 12/2002 | McLellan et al. |
| 6,498,392 B2 | 12/2002 | Azuma |
| 6,507,096 B2 | 1/2003 | Gang |
| 6,507,098 B1 * | 1/2003 | Lo et al. .................. 257/686 |
| 6,507,120 B2 | 1/2003 | Lo et al. |
| 6,534,849 B1 | 3/2003 | Gang |
| 6,534,874 B1 * | 3/2003 | Matsumura .................. 257/777 |
| 6,545,332 B2 | 4/2003 | Huang |
| 6,545,345 B1 | 4/2003 | Glenn et al. |
| 6,559,525 B2 | 5/2003 | Huang |
| 6,566,168 B2 | 5/2003 | Gang |
| 6,566,760 B1 * | 5/2003 | Kawamura et al. ......... 257/777 |
| 6,583,503 B2 | 6/2003 | Akram et al. |
| 6,603,196 B2 | 8/2003 | Lee et al. |
| 6,624,005 B1 | 9/2003 | Di Caprio et al. |
| 6,650,006 B2 * | 11/2003 | Huang et al. ............... 257/686 |
| 6,667,546 B2 | 12/2003 | Huang et al. |
| 6,690,089 B2 * | 2/2004 | Uchida .................. 257/686 |
| 6,747,361 B2 * | 6/2004 | Ichinose .................. 257/784 |
| 6,841,858 B2 * | 1/2005 | Shim et al. .................. 257/676 |
| 6,861,288 B2 * | 3/2005 | Shim et al. .................. 438/109 |
| 6,905,913 B2 * | 6/2005 | Ohie .................. 438/108 |
| 6,906,424 B2 * | 6/2005 | Kinsman .................. 257/777 |
| 2001/0008305 A1 | 7/2001 | McLellan et al. |
| 2001/0014538 A1 | 8/2001 | Kwan et al. |
| 2002/0011654 A1 | 1/2002 | Kimura |
| 2002/0024122 A1 | 2/2002 | Jung et al. |
| 2002/0027297 A1 | 3/2002 | Ikenaga et al. |
| 2002/0105091 A1 * | 8/2002 | Ishii et al. .................. 257/777 |
| 2002/0140061 A1 | 10/2002 | Lee |
| 2002/0140068 A1 | 10/2002 | Lee et al. |
| 2002/0163015 A1 | 11/2002 | Lee et al. |
| 2003/0030131 A1 | 2/2003 | Lee et al. |
| 2003/0073265 A1 | 4/2003 | Hu et al. |
| 2004/0056277 A1 | 3/2004 | Karnezos |
| 2004/0061212 A1 | 4/2004 | Karnezos |
| 2004/0061213 A1 | 4/2004 | Karnezos |
| 2004/0063242 A1 | 4/2004 | Karnezos |
| 2004/0063246 A1 | 4/2004 | Karnezos |

| | | | | | |
|---|---|---|---|---|---|
| 2004/0065963 | A1 | 4/2004 | Karnezos | | |

FOREIGN PATENT DOCUMENTS

| | | | | | |
|---|---|---|---|---|---|
| EP | 0393997 | 10/1990 | JP | 369248 | 7/1991 |
| EP | 0459493 | 12/1991 | JP | 3177060 | 8/1991 |
| EP | 0720225 | 3/1996 | JP | 4098864 | 9/1992 |
| EP | 0720234 | 3/1996 | JP | 5129473 | 5/1993 |
| EP | 0794572 A2 | 10/1997 | JP | 5166992 | 7/1993 |
| EP | 0844665 | 5/1998 | JP | 5283460 | 10/1993 |
| EP | 0936671 | 8/1999 | JP | 692076 | 4/1994 |
| EP | 098968 | 3/2000 | JP | 6140563 | 5/1994 |
| EP | 1032037 | 8/2000 | JP | 6260532 | 9/1994 |
| JP | 55163868 | 12/1980 | JP | 7297344 | 11/1995 |
| JP | 5745959 | 3/1982 | JP | 7312405 | 11/1995 |
| JP | 58160095 | 8/1983 | JP | 864634 | 3/1996 |
| JP | 59208756 | 11/1984 | JP | 8083877 | 3/1996 |
| JP | 59227143 | 12/1984 | JP | 8125066 | 5/1996 |
| JP | 60010756 | 1/1985 | JP | 96-4284 | 6/1996 |
| JP | 60116239 | 8/1985 | JP | 8222682 | 8/1996 |
| JP | 60195957 | 10/1985 | JP | 8306853 | 11/1996 |
| JP | 60231349 | 11/1985 | JP | 98205 | 1/1997 |
| JP | 6139555 | 2/1986 | JP | 98206 | 1/1997 |
| JP | 629639 | 1/1987 | JP | 98207 | 1/1997 |
| JP | 6333854 | 2/1988 | JP | 992775 | 4/1997 |
| JP | 63067762 | 3/1988 | JP | 9293822 | 11/1997 |
| JP | 63188964 | 8/1988 | JP | 10022447 | 1/1998 |
| JP | 63205935 | 8/1988 | JP | 10163401 | 6/1998 |
| JP | 63233555 | 9/1988 | JP | 10199934 | 7/1998 |
| JP | 63249345 | 10/1988 | JP | 10256240 | 9/1998 |
| JP | 63289951 | 11/1988 | JP | 00150765 | 5/2000 |
| JP | 63316470 | 12/1988 | JP | 556398 | 10/2000 |
| JP | 64054749 | 3/1989 | JP | 2001060648 | 3/2001 |
| JP | 1106456 | 4/1989 | JP | 200204397 | 8/2002 |
| JP | 1175250 | 7/1989 | KR | 941979 | 1/1994 |
| JP | 1205544 | 8/1989 | KR | 9772358 | 11/1997 |
| JP | 1251747 | 10/1989 | KR | 100220154 | 6/1999 |
| JP | 2129948 | 5/1990 | KR | 0049944 | 6/2002 |
| | | | WO | 9956316 | 11/1999 |
| | | | WO | 9967821 | 12/1999 |

* cited by examiner

SEMICONDUCTOR PACKAGE AND ITS MANUFACTURING METHOD

CROSS-REFERENCE TO RELATED APPLICATIONS

Not Applicable

STATEMENT RE: FEDERALLY SPONSORED RESEARCH/DEVELOPMENT

Not Applicable

BACKGROUND OF THE INVENTION

1. Field of the Invention

The present invention relates generally to semiconductor packages and, more particularly, to a quad flat package (QFP) which is uniquely configured to provide increased signal processing capability without an increase in size as a result of the inclusion of one or more internal semiconductor packages.

2. Description of the Related Art

One of the most commonly used semiconductor packages in the electronics industry is referred to as a quad flat package (QFP). A typical QFP includes a die pad or paddle which has a quadrangular configuration and is located at the approximate center of the package. Arranged along all four sides of the die paddle in spaced relation thereto is a plurality of leads. A semiconductor die is attached to the die paddle, and is electrically connected to the leads through the use of conductive wires. The semiconductor die, the die paddle, the leads and the conductive wires are encapsulated by an encapsulant which, upon hardening, forms a package body of the package. Typically, the leads protrude from respective ones of four sides of the package body, and are each bent so as to have a gull-wing configuration. These leads are used to mount the QFP to an external device. Quad flat packages having the above-defined structural attributes are manufactured through the use of processes which are relatively simple, and thus cost efficient.

However, one of the primary drawbacks in quad flat packages as currently known is that many of the leads arranged about the periphery of the die paddle must be used for grounding or power supply. As a result, difficulties often arise in ensuring a sufficient number of leads available for signal transfer. Due to known restrictions associated with the chemical etching or mechanical stamping process employed in manufacturing the die paddle and leads of the quad flat package, an increase in the number of leads results in a significant increase in the overall size of the package. As will be recognized, an increase in the size of the package in turn requires a larger area for the mounting thereof to an external device, thus making it more difficult to mount the package in small electronic appliances or devices such as cellular phones, personal digital assistants, and portable notebook computers.

Also known in the electronics industry are various techniques for stacking semiconductor packages upon each other in a manner achieving a desired pattern of electrical interconnection between the semiconductor dies of the stacked packages. Though package-to package stacks provide benefits of increased signal processing and transfer capability, they are often difficult to use in small electronic appliances or devices due to their relatively large thickness. Additionally, there are typically limitations in the number of packages that may be stacked upon each other in a package-to-package stack, with the pattern design of the printed circuit boards for accommodating the stack often becoming complicated, and the package stack itself being relatively costly to manufacture.

The present invention provides a quad flat package or QFP type semiconductor package which provides an increased number of leads for signal transfer without the penalty of increased package size. The increased signal transfer capability is provided by employing principles of stacking internally within the package. These, as well as other attributes and advantages of the present invention, will be described in more detail below.

BRIEF SUMMARY OF THE INVENTION

In accordance with the present invention, there is provided a uniquely configured semiconductor package (e.g., a quad flat package) which provides increased signal processing capability without a resultant increase in package size. The increased signal processing capability is imparted by the inclusion of one or more inner semiconductor packages which is/are integrated into the package body of the package. The semiconductor package of the present invention may be configured such that the inner package(s) are partially exposed in the package body for independent electrical connection to an underlying device. Alternatively, the inner package(s) may be completely covered by the package body and electrically connected to the leads of the semiconductor package, the semiconductor die of semiconductor package, and/or each other.

The present invention is best understood by reference to the following detailed description when read in conjunction with the accompanying drawings.

BRIEF DESCRIPTION OF THE DRAWINGS

These, as well as other features of the present invention, will become more apparent upon reference to the drawings wherein.

Common reference numerals are used throughout the drawings and detailed description to indicate like elements.

DETAILED DESCRIPTION OF THE INVENTION

Figure 1A:
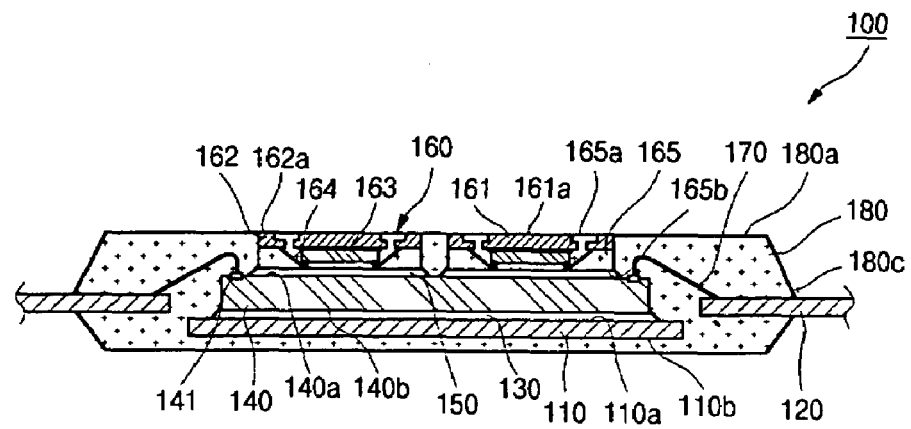
FIG. 1A is a cross-sectional view of a semiconductor package constructed in accordance with a first embodiment of the present invention.
Figure 1B:
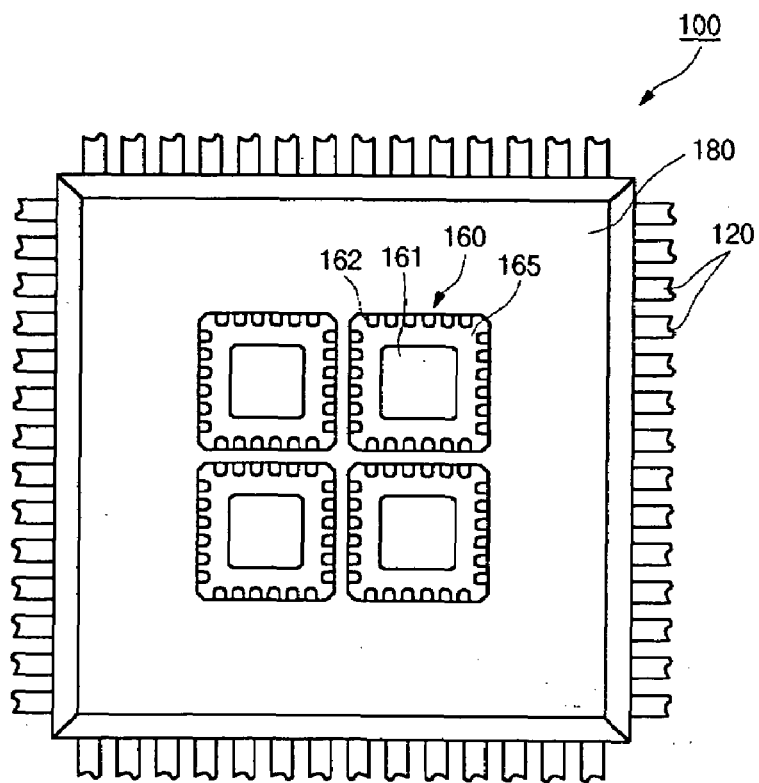
FIG. 1B is a top plan view of the semiconductor package shown in FIG. 1A.
Figure 1C:
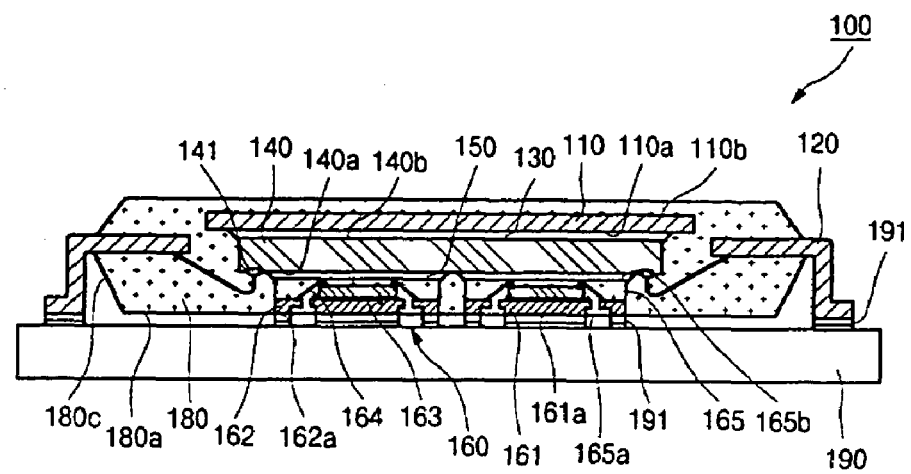
FIG. 1C is a cross-sectional view of the semiconductor package shown in FIG. 1A as mounted to an external device.

Referring now to the drawings wherein the showings are for purposes of illustrating preferred embodiments of the present invention only, and not for purposes of limiting the same, FIGS. 1A–1C illustrate a semiconductor package 100 constructed in accordance with a first embodiment of the present invention. The semiconductor package 100 comprises a leadframe L/F (shown in FIG. 4A) which itself includes a die paddle 110 having a generally quadrangular (e.g., square, rectangular) configuration. The die paddle 110 defines a generally planar upper surface 110a and an opposed, generally planar lower surface 110b. Those of ordinary skill in the art will recognize that the die paddle 110 need not necessarily have a quadrangular shape, and may alternatively have a differing shape such as polygonal shape.

In addition to the die paddle 110, the leadframe L/F includes a plurality of leads 120 which are arranged along the periphery of the die paddle 110. The leads 120 are preferably segregated into four sets, with the leads 120 of each set extending along and in spaced relation to a respective one of the four sides or peripheral edge segments of the die paddle 110. However, those of ordinary skill in the art will recognize that the arrangement of the leads 120 as shown in FIG. 1B is exemplary only, in that the leads 120 may alternatively be provided in two sets which extend along and in spaced relation to respective ones of two sides of the die paddle 110. Other arrangements of the leads 120 are also contemplated to be within the scope of the present invention. The leads 120 of each set are preferably spaced from each other at a constant pitch.

It is contemplated that the die paddle 110 and the leads 120 will be fabricated from a conductive metal material such as copper, copper alloy, iron, or equivalents thereto. It is further contemplated that the die paddle 110 and leads 120 may be substituted in the semiconductor package 100 with a hard printed circuit board, a soft printed circuit board, a ceramic printed circuit board, or equivalents thereto.

The semiconductor package 100 of the first embodiment further comprises a semiconductor die 140 which includes a generally planar upper surface 140a and an opposed, generally planar lower surface 140b. The lower surface 140b of the semiconductor die 140 is attached to the upper surface 110a of the die paddle 110. Such attachment is preferably facilitated through the use of an adhesive agent 130 such as an adhesive, adhesive film/tape, or epoxy. Disposed on the upper surface 140a of the semiconductor die 140 are a plurality of terminals or bond pads 141. The bond pads 141 are located in close proximity to the peripheral edge of the upper surface 140a of the semiconductor die 140. The location of the bond pads 141 along the outer periphery of the upper surface 140a is to provide sufficient open area to accommodate one or more inner packages 160 of the semiconductor package 100, as will be described in more detail below.

The semiconductor package 100 of the first embodiment further comprises a plurality (e.g., four) inner packages 160. Each inner package 160 includes an inner die paddle 161 which itself preferably has a generally quadrangular (e.g., square, rectangular) configuration. Extending about the periphery of the die paddle 161 in spaced relation thereto is a plurality of inner leads 162. The inner leads 162 are also preferably segregated into four sets, with the inner leads 162 of each set extending along and in spaced relation to a respective one of the four sides or peripheral edge segments of the inner die paddle 161. The inner leads 162 of each set are preferably spaced from each other at a constant pitch. Attached to the lower surface of the inner die paddle 161 is an inner semiconductor die 163. Conductive pads or terminals of the inner semiconductor die 163 are electrically connected to respective ones of the inner leads 162 through the use of inner conductive wires 164. The inner die paddle 161, the inner leads 162, the inner semiconductor die 163, and the inner conductive wires 164 of each inner package 160 are encapsulated by an encapsulant material which, upon hardening, forms an inner package body 165 of the inner package 160.

In each inner package 160, the fully formed inner package body 165 defines a generally planar upper surface 165a. Similarly, the inner die paddle 161 defines a generally planar upper surface 161a, which is that surface opposite that to which the semiconductor die 163 is attached. Additionally, each of the inner leads 162 defines a generally planar upper surface 162a, which is that surface opposite that to which the inner conductive wires 164 are extended. In each inner package 160, the upper surface 161a of the inner die paddle 161 and the upper surfaces 162a of the inner leads 162 are preferably exposed in and substantially flush with the upper surface 165a of the inner package body 165. Thus, the upper surfaces 161a, 162a, 165a extend in generally co-planar relation to each other. As seen in FIGS. 1A and 1B, the inner package body 165 of each inner package 160 also defines a generally planar lower surface 165b which is disposed in opposed relation to the upper surface 165a thereof. The lower surface 165b of the inner package body 165 of each inner package 160 is preferably attached to the upper surface 140a of the semiconductor die 140 through the use of an adhesive agent 150.

The semiconductor package 100 of the first embodiment is shown in FIGS. 1A–1C as including four inner packages 160 attached to the upper surface 140a of the semiconductor die 140 in a generally square pattern. However, those of ordinary skill in the art will recognize that the number of inner packages 160 included in the semiconductor package 100 is not limited to four as shown, but may include greater or fewer inner packages 160. Moreover, the present invention is not intended to be limited to the above-described specific construction or configuration of each inner package 160. That is, any type of inner packages having signal transfer nodes exposed through one or more surfaces of the package body thereof may be employed in the semiconductor package 100 of the present invention. Moreover, any inner package incorporated into the semiconductor package 100 may employ the use of a hard printed circuit board, a soft printed circuit board, or a ceramic printed circuit board, as an alternative to the above-described inner die paddle(s) 161 and inner leads 162. As indicated above, the placement or positioning of the bond pads 141 of the semiconductor die 140 in close proximity to the peripheral edge of the upper surface 140a thereof provides a substantial open central area on the upper surface 140a which is sufficient to accommodate the inner package(s) 160.

The semiconductor package 100 of the first embodiment further comprises a plurality of conductive wires 170 which are used to electrically connect at least some of the bond pads 141 of the semiconductor die 140 to respective leads 120. As a result, an electrical signal from the semiconductor die 140 can be transferred through the conductive wires 170 and the leads 120 to an external device 190 (shown in FIG. 1C), with an electrical signal from the external device 190 being able to be transferred to the semiconductor die 140 through an inverse path. The conductive wires 170 may be gold wires, aluminum wires, copper wires, or equivalents thereto.

In the semiconductor package 100, the die paddle 110, the leads 120, the semiconductor die 140, the inner package(s) 160 and the conductive wires 170 are encapsulated with an encapsulant material which, upon hardening, forms a package body 180 of the semiconductor package 100. As will be recognized, the package body 180 protects the components it covers from external dust and from moisture. The package body 180 may be fabricated from epoxy, a plastic molding compound, ceramic, or equivalents thereto. In the semiconductor package 100, at least some of the leads 120 protrude from a side surface 180c of the package body 180, thereby allowing the semiconductor package 100 to be easily mounted to the external device 190 in the manner shown in FIG. 1C. To assist in such mounting, those leads 120 which protrude from the side surface 180c of the package body 180 are preferably bent to impart a gull-wing configuration thereto.

In addition to the side surface 180c, the fully formed package body 180 of the semiconductor package 100 defines a generally planar upper surface 180a. As seen in FIGS. 1A–1C, the package body 180 of the semiconductor package 100 is formed such that the upper surface 161a of the inner die paddle 161, the upper surfaces 162a of the inner leads 162, and the upper surface 165a of the inner package body 165 of each inner package 160 are exposed in and substantially flush with the upper surface 180a of the package body 180. As a result, the upper surfaces 161a, 162a, 165a, 180a extend in generally co-planar relation to each other. Thus, as shown in FIG. 1C, not only may the leads 120 of the semiconductor package 100 be electrically connected to corresponding pads of the external device 190, but the inner die paddle 161 and the inner leads 162 of each inner package 160 of the semiconductor package 100 may be electrically connected to corresponding pads on the external device 190 as well. Any such electrical connection between the semiconductor package 100 and the external device 190 is preferably accomplished through the use of layers of solder 191. It should be noted that there is no electrical connection in the semiconductor package 100 between the inner package(s) 160 and the semiconductor die 140 or between the inner package(s) 160 and the leads 120. However, these components may optionally be electrically connected to each other through the external device 190. As such, an electrical signal from the semiconductor die 140 is transferred through the conductive wires 170 and the leads 120 to the external device 190, with an electrical signal from the inner semiconductor die 163 of each inner package 160 being transferred through corresponding inner conductive wires 164 and corresponding inner leads 162 to the external device 190. As shown in FIG. 1C, to allow for the above-described manner of electrical interconnection, the semiconductor package 100 is flipped over or inverted to facilitate its connection to the external device 190, thus causing certain ones of those surfaces referred to above as "upper surfaces" to be directly adjacent the surface of the external device 190 to which the semiconductor device 100 is mounted.

Figure 4A:
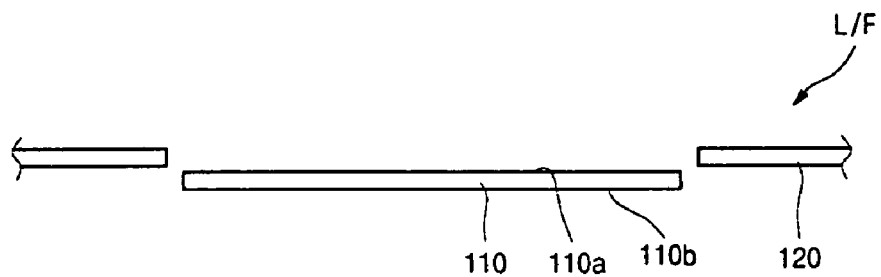
FIGS. 4A–4E illustrate an exemplary sequence of steps which may be used to facilitate the fabrication of the semiconductor package of the first embodiment shown in FIGS. 1A–C.
Figure 4B:
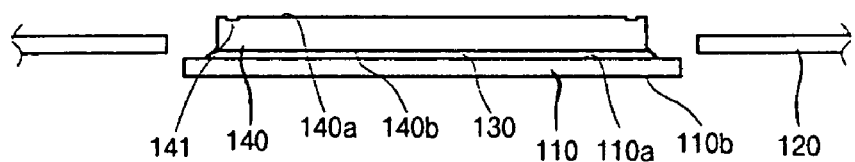
Figure 4C:
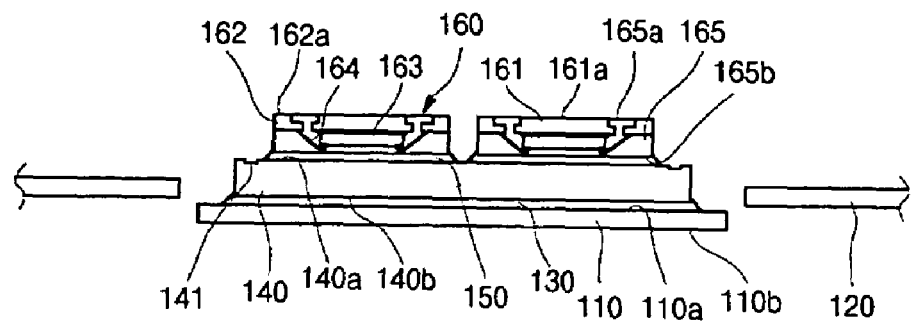

Referring now to FIGS. 4A–4E, there is shown an exemplary sequence of steps which may be used to facilitate the fabrication of the semiconductor package 100 of the first embodiment. In the initial step of the sequence, the leadframe L/F is provided, such leadframe L/F including the die paddle 110 and leads 120 have the above-described structural attributes and special relationships relative to each other (FIG. 4A). Thereafter, the semiconductor die 140 is attached to the upper surface 110a of the die paddle 110 through the use of the adhesive agent 130 (FIG. 4B). The inner package(s) 160 having the above-described structural attributes are then attached to the upper surface 140a of the semiconductor die 140 in the aforementioned manner through the use of the adhesive agent 150 (FIG. 4C). As indicated above, the inner package(s) 160 are attached to the semiconductor die 140 at positions which do not cause the same to overlap any of the bond pads 141, such bond pads 141 also not being contaminated by the adhesive agent 150.

Figure 4D:
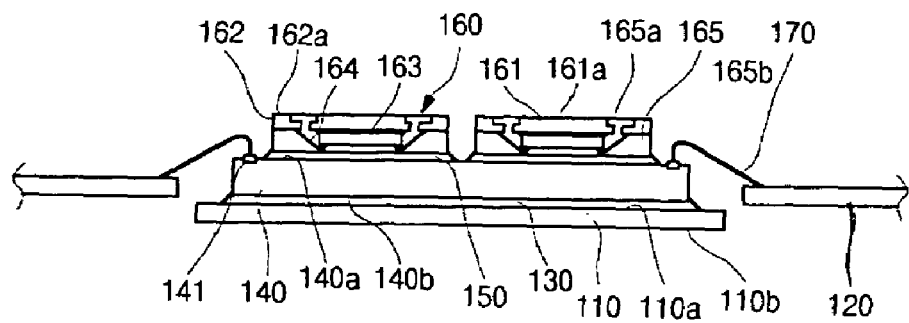
Figure 4E:
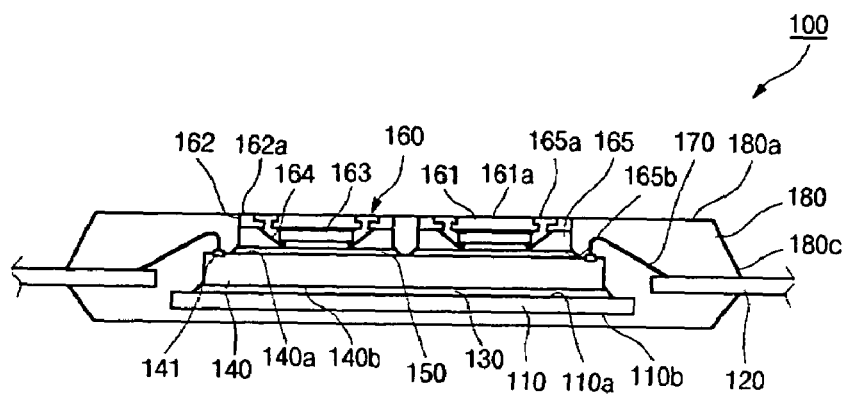

Subsequent to the attachment of the inner package(s) 160 to the upper surface 140a of the semiconductor die 140, a wire bonding step is completed wherein the bond pads 141 of the semiconductor die 140 are electrically connected to the leads 120 through the use of the conductive wires 170 (FIG. 4D). Thereafter, the package body 180 is formed to have the above-described structural attributes (FIG. 4E), portions of the inner package(s) 160 being exposed in the upper surface 180a of the package body 180 in the aforementioned manner. The semiconductor package 100 produced as a result of the completion of this fabrication methodology includes on or more inner packages 160 which are packaged in the single semiconductor package 100, thus maximizing package density. Since the inner die paddle 161 and the inner leads 160 of the inner package(s) 160 are exposed in the package body 180, the semiconductor package 100 has a considerably reduced thickness, though possessing substantially increased signal transfer capability. Those of ordinary skill in the art will recognize that the construction of the semiconductor package 100 is not necessarily limited to the precise order or sequence of steps described above. For example, the electrical connection of the semiconductor die 140 to the leads 120 through the use of the conductive wires 170 may occur prior to the attachment of the inner package(s) 160 to the semiconductor die 140.

Figure 2A:
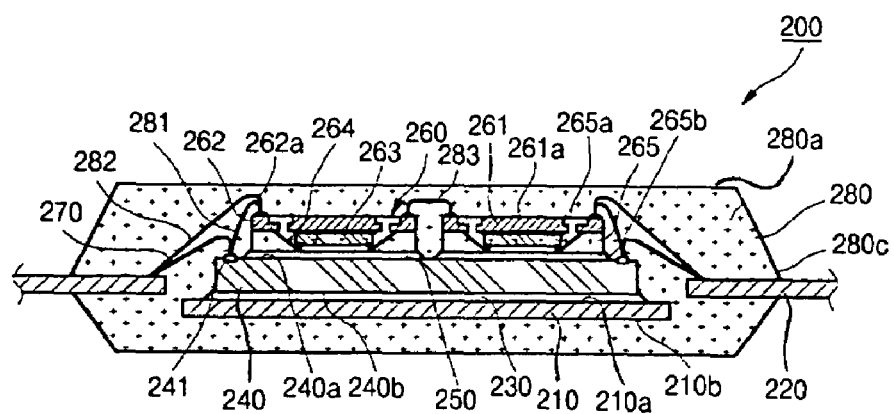
FIG. 2A is a cross-sectional view of a semiconductor package constructed in accordance with a second embodiment of the present invention.
Figure 2B:
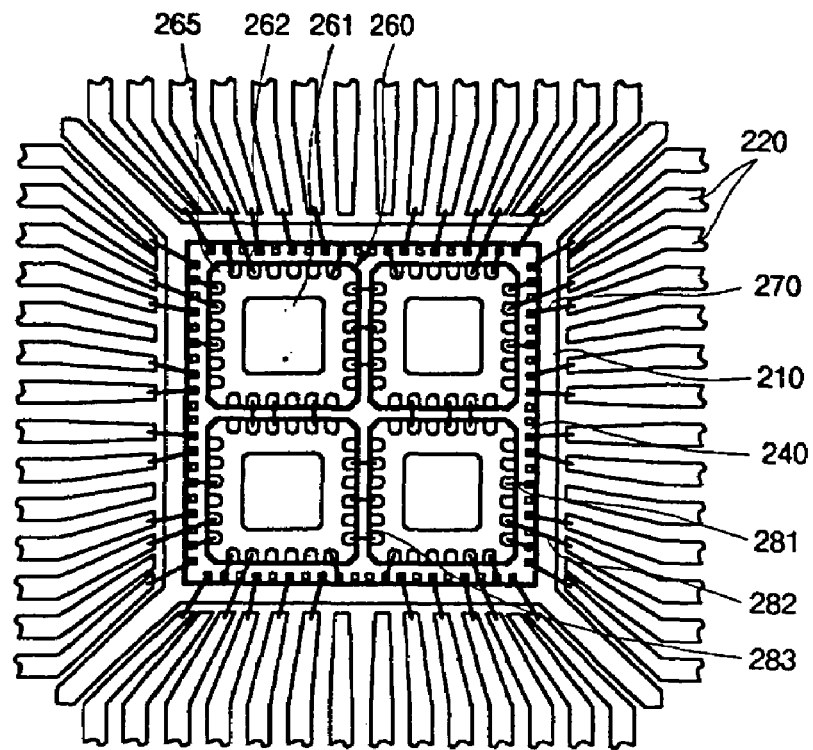
FIG. 2B is a top plan view of the semiconductor package shown in FIG. 2A with the package body removed therefrom.

Referring now to FIGS. 2A and 2B, there is shown a semiconductor package 200 constructed in accordance with a second embodiment of the present invention. The semiconductor package 200 of the second embodiment bears substantial similarity in construction to the semiconductor package 100 of the first embodiment, with the 200 series reference numerals in FIGS. 2A and 2B being used to identify the same structures identified by the corresponding 100 series reference numerals included in FIGS. 1A–1C. In this regard, only the distinctions between the semiconductor packages 200, 100 will be discussed below.

In the semiconductor package 200, conductive wires 270 are used to electrically connect at least some of the bond pads 241 of the semiconductor die 240 to respective leads 220. However, in addition to the conductive wires 270, the semiconductor package 200 of the second embodiment also includes conductive wires 281, 282, and 283 which, like the conductive wires 270, are covered by the package body 280 of the semiconductor package 200. The conductive wires 281, 282, 283 are used to establish electrical interconnection between the inner package(s) 260 and the semiconductor die 240, between the inner package(s) 260 and the leads 220, or between the inner packages 260 themselves. As shown in FIGS. 2A and 2B, the conductive wires 281 electrically connect at least some of the inner leads 262 of the inner packages 260 to respective bond pads 241 of the semiconductor die 240. The conductive wires 282 electrically connect at least some of the inner leads 262 of the inner packages 260 to respective leads 220. Finally, the conductive wires 283 electrically connect at least some of the inner leads 262 of one inner package 260 to respective inner leads 262 of another inner package 260. As a result, it is unnecessary to interpose a grounding ring or power supply ring between the die paddle 210 and the leads 220, thus allowing more of the leads 220 to be used for signal transfer. Moreover, in the semiconductor package 200, the length of the wires for grounding or power transfer can be reduced to reduce loss of electrical signal in the wires, with the additional absence of distortion of the grounding ring or power supply improving the reliability of the semiconductor package 200. As seen in FIG. 2A, the package body 280 of the semiconductor package 200 completely covers the die paddle 210, semiconductor die 240, inner packages 260, and conductive wires 270, 281, 282, 283. Thus, in contrast to the semiconductor package 100 of the first embodiment, no portion of any inner package 260 is exposed in the package body 280 of the semiconductor package 200.

Figure 5A:
FIGS. 5A–5E illustrate an exemplary sequence of steps which may be used to facilitate the fabrication of the semiconductor package of the second embodiment shown in FIGS. 2A and 2B.
Figure 5B:
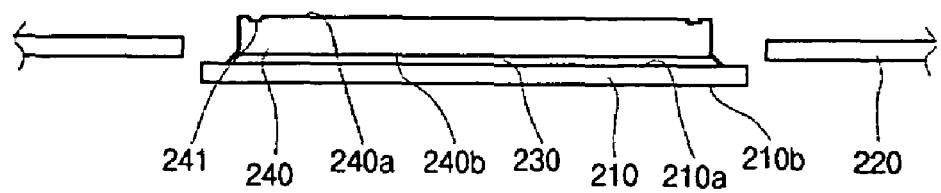
Figure 5C:
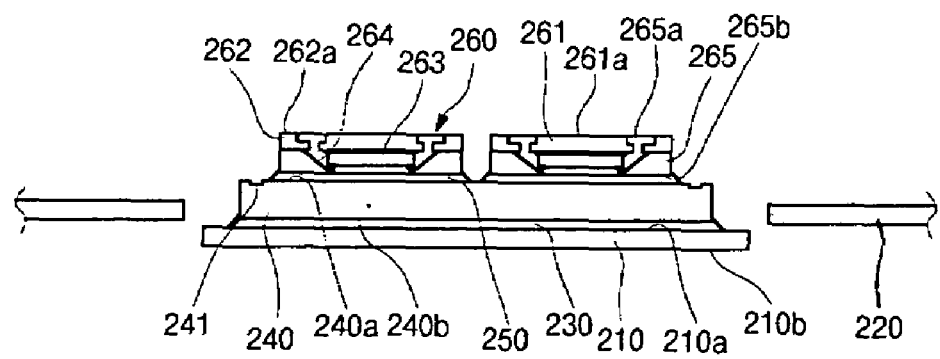

Referring now to FIGS. 5A–5E, there is shown an exemplary sequence of steps which may be used to facilitate the fabrication of the semiconductor package 200 of the second embodiment. In the initial step of the sequence, the leadframe L/F is provided, such leadframe L/F including the die paddle 210 and leads 220 (FIG. 5A). Thereafter, the semiconductor die 240 is attached to the upper surface 210a of the die paddle 210 through the use of the adhesive agent 230 (FIG. 5B). The inner package(s) 260 are then attached to the upper surface 240a of the semiconductor die 240 through the use of the adhesive agent 250 (FIG. 5C).

Figure 5D:
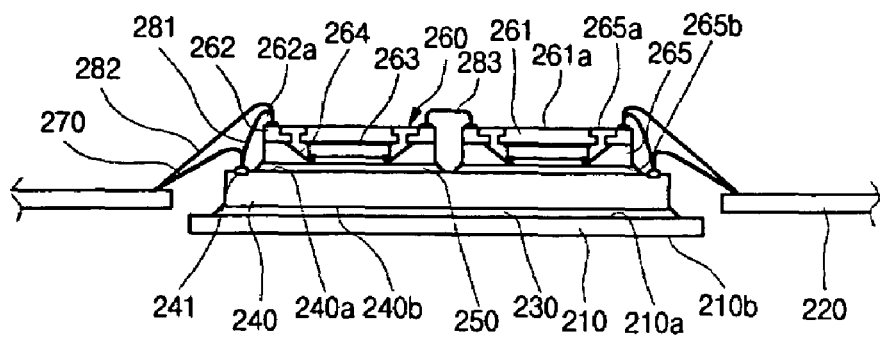
Figure 5E:
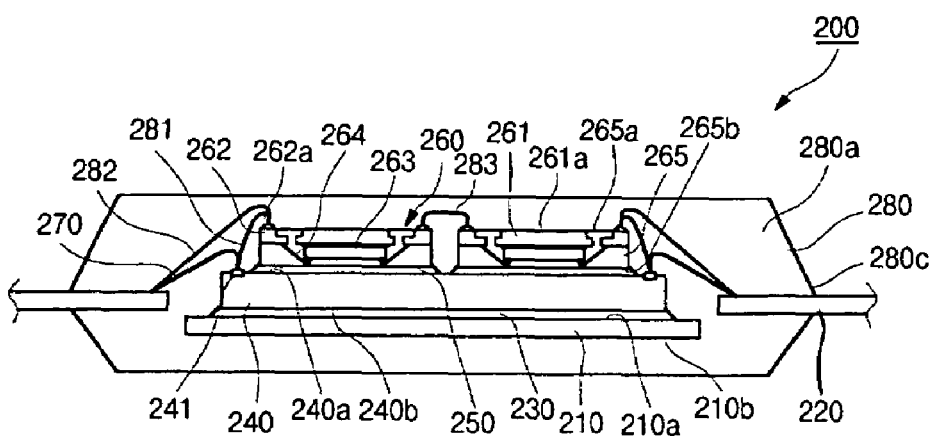

Subsequent to the attachment of the inner package(s) 260 to the upper surface 240a of the semiconductor die 240, a wire bonding step is completed wherein the conductive wires 270, 281, 282, 283 are used to establish electrical interconnections between the various components of the semiconductor package 200 in the above-described manner (FIG. 5D). Thereafter, the package body 280 is formed the above-described structural attributes (FIG. 5E), the inner package(s) 260 being completely covered by the package body 280. As previously stated in relation to the manufacturing methodology corresponding to the semiconductor package 100 of the first embodiment, those of ordinary skill in the art will recognize that the construction of the semiconductor package 200 is not necessarily limited to the precise order or sequence of steps described above.

Figure 3A:
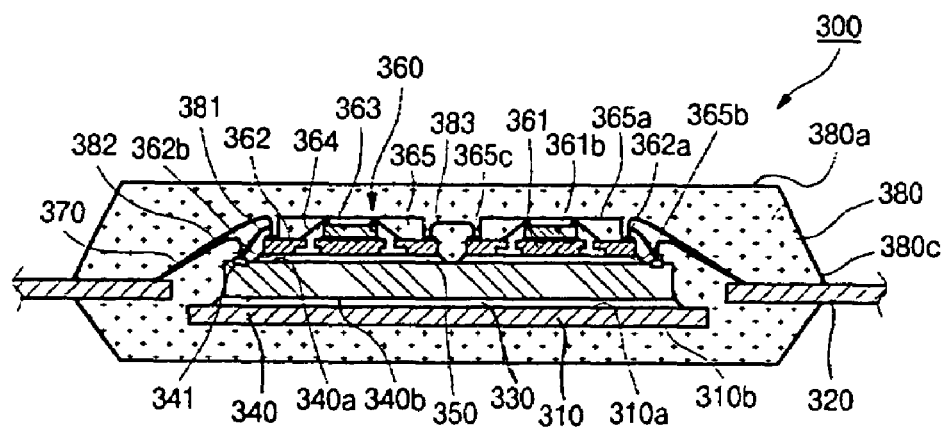
FIG. 3A is a cross-sectional view of a semiconductor package constructed in accordance with a third embodiment of the present invention.
Figure 3B:
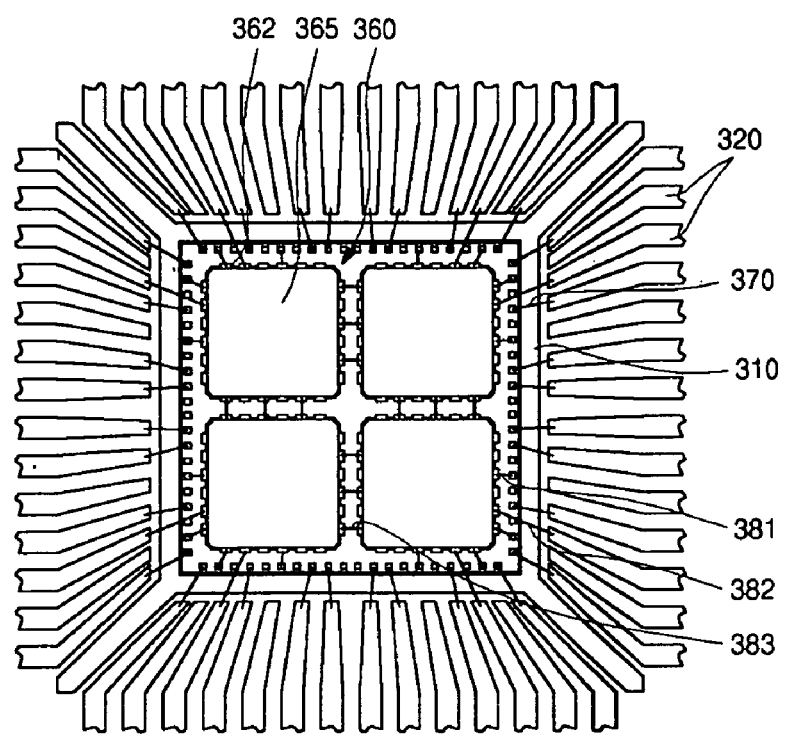
FIG. 3B is a top plan view of the semiconductor package shown in FIG. 3A with the package body removed therefrom.

Referring now FIGS. 3A and 3B, there is shown a semiconductor package 300 constructed in accordance with a third embodiment of the present invention. The semiconductor package 300 of the third embodiment bears substantial similarity in construction to the semiconductor package 200 of the first embodiment, with the 300 series reference numerals in FIGS. 3A and 3B being used to identify the same structures identified by the corresponding 200 series reference numerals included in FIGS. 2A and 2B, and the corresponding 100 series reference numerals included in FIGS. 1A–1C. Only the distinctions between the semiconductor packages 300, 200 will be discussed below.

One of the primary distinctions between the semiconductor packages 200, 300 lies in the structural attributes of the inner package(s) 360 of the semiconductor package 300 in comparison to those of the inner package(s) 260 of the semiconductor package 200. More particularly, in each inner package 360 of the semiconductor package 300, the inner die paddle 361 defines a generally planar lower surface 361b which is disposed in opposed relation to the generally planar upper surface 361a thereof. Similarly, each inner lead 362 defines a generally planar lower surface 362b which is disposed in opposed relation to the generally planar upper surface 362a thereof. The inner package body 365 itself defines a generally planar lower surface 365b which is disposed in opposed relation to the generally planar upper surface 365a thereof. In each inner package 360, the inner package body 365 is formed such that the lower surface 361b of the inner die paddle 361 and the lower surfaces 362b of the inner leads 362 are exposed in and substantially flush with the lower surface 365b of the inner package body 365. Thus, the lower surfaces 361b, 362b, 365b extend in generally co-planar relation to each other.

Moreover, the inner package body 365 of each inner package 360 is formed such that portions of each inner lead 362 protrude from a side surface 365c of the inner package body 365. As a result, portions of the upper surfaces 362a of each of the inner leads 362 are not covered by the inner package body 365, and thus are exposed. In contrast to the configurations of the semiconductor packages 100, 200 wherein the inner packages 160, 260 are attached to the semiconductor die 140, 240 such that the exposed upper surfaces 161a, 162a, 165a, 261a, 262a, 265a are disposed furthest from the upper surface 140a, 240a of the semiconductor die 140, 240, in the semiconductor package 300, the exposed lower surfaces 361b, 362b, 365b of each inner package 360 are attached to the upper surface 340a of the semiconductor die 340 through the use of the adhesive agent 350. As shown in FIGS. 3A and 3B, in the semiconductor package 300, the conductive wires 381 are used to electrically connect the exposed portions of the upper surfaces 362a of at least some of the inner leads 362 to respective bond pads 341 of the semiconductor die 340, with the conductive wires 382 being used to electrically connect the exposed portions of the upper surfaces 362a of at least some of the inner leads 362 to respective leads 320. The conductive wires 383 are used to electrically connect the exposed portions of the upper surfaces 362a of at least some of the inner leads 362 of one inner package 360 to the exposed portions of the upper surfaces 362a of respective inner leads 362 of another inner package 360. The conductive wires 370 are used to electrically connect at least some of the bond pads 341 of the semiconductor die 340 to respective leads 320.

In the semiconductor package 300, the inner leads 362 of each inner package 360 may be used for either grounding or power supply. Thus, in the semiconductor package 300 it is not necessary to interpose a grounding ring or power supply ring between the die paddle 310 and the leads 320. Additionally, the length of the wires for grounding or power transfer can be reduced, thus imparting improved reliability to the semiconductor package 300. Further, the conductive wires 370, 381, 382, 383 of the semiconductor package 300 are contemplated to be configured so as to not extend higher than the level of the upper surface 365a of each inner package body 365, thus allowing the semiconductor package 300 to have a reduced thickness.

Figure 6A:
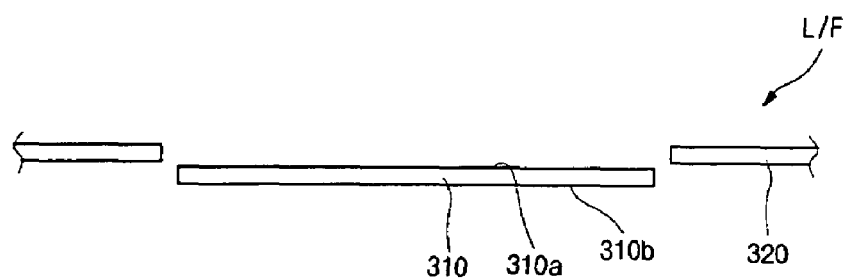
FIGS. 6A–6E illustrate an exemplary sequence of steps which may be used to facilitate the fabrication of the semiconductor package of the third embodiment shown in FIGS. 3A and 3B.
Figure 6B:
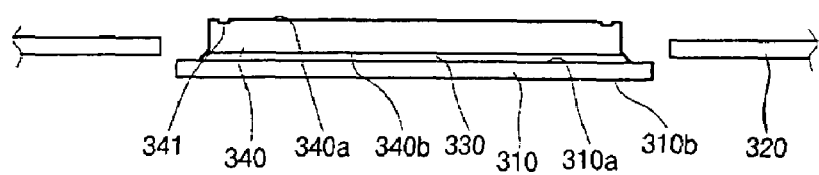
Figure 6C:
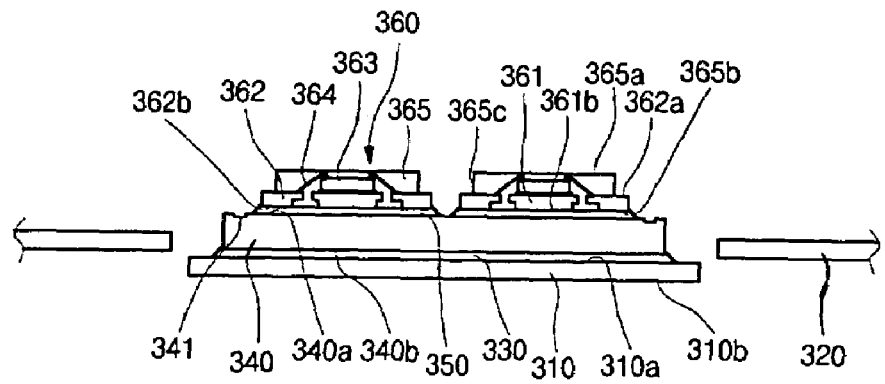

Referring now to FIGS. 6A–6E, there is shown an exemplary sequence of steps which may be used to facilitate the fabrication of the semiconductor package 300 of the third embodiment. In the initial step of the sequence, the leadframe L/F is provided, such leadframe L/F including the die paddle 310 and leads 320 (FIG. 6A). Thereafter, the semiconductor die 340 is attached to the upper surface 310a of the die paddle 310 through the use of the adhesive agent 330 (FIG. 6B). The inner package(s) 360 having the above-described structural attributes are then attached to the upper surface 340a of the semiconductor die 340 in the aforementioned manner through the use of the adhesive agent 350 (FIG. 6C).

Figure 6D:
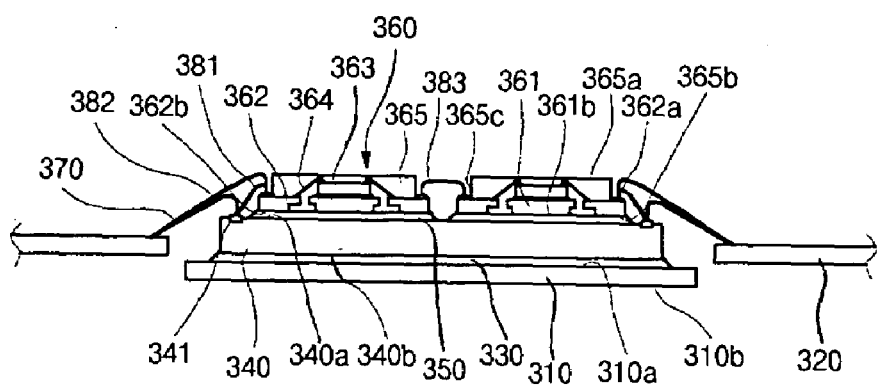
Figure 6E:
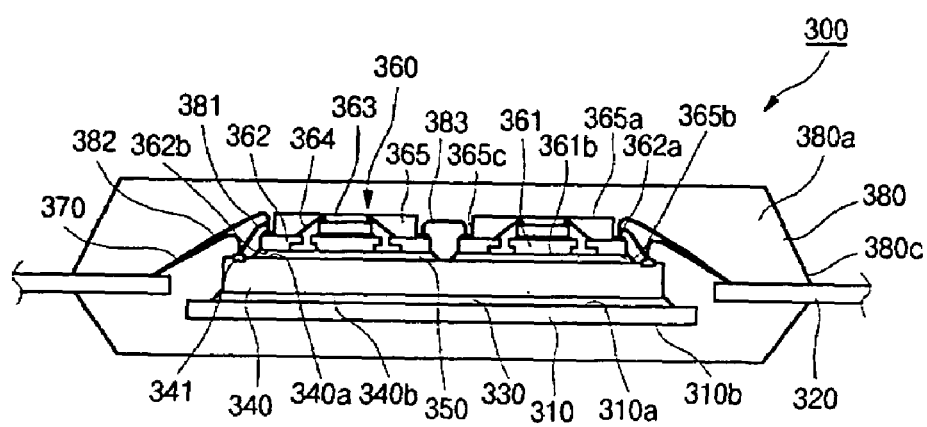

Subsequent to the attachment of the inner package(s) 360 to the upper surface 340a of the semiconductor die 340, a wire bonding step is completed wherein the conductive wires 370, 381, 382, 383 are used to electrically interconnect various components of the semiconductor package 300 to each other in the above-described manner (FIG. 6D). Thereafter, the package body 380 is formed to have the above-described structural attributes (FIG. 6E). Again, those of ordinary skill in the art will recognize that the construction of the semiconductor package 300 is not necessarily limited to the precise order or sequence of steps described above.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A semiconductor package, comprising:
   a die paddle;
   a plurality of leads extending at least partially about the die paddle in spaced relation thereto;
   a semiconductor die attached to the die paddle and electrically connected to at least some of the leads;
   at least one inner package attached to the semiconductor die, the inner package being electrically isolated from the semiconductor die; and
   a package body encapsulating the die paddle, the leads, the semiconductor die, and the inner package such that a portion of each of the leads and a portion of the inner package are exposed in the package body.

2. The semiconductor package of claim 1 wherein the semiconductor die is electrically connected to the leads by conductive wires which are covered by the package body.

3. The semiconductor package of claim 1 wherein:
   the die paddle has a quadrangular configuration defining four peripheral edge segments; and
   the leads are segregated into four sets which extend along and in spaced relation to respective ones of the four peripheral edge segments of the die paddle.

4. The semiconductor package of claim 1 wherein the inner package comprises:
   an inner die paddle having a generally planar inner die paddle surface;
   a plurality of inner leads extending at least partially about and in spaced relation to the inner die paddle, each of the inner leads having a generally planar inner lead surface;
   an inner semiconductor die attached to the inner die paddle and electrically connected to at least one of the inner leads; and
   an inner package body encapsulating the inner die paddle, the inner leads, and the inner semiconductor die such that the inner die paddle surface and the inner lead surface of each of the inner leads is exposed in and substantially flush with a generally planar inner package body surface of the inner package body.

5. The semiconductor package of claim 4 wherein the package body is formed such that the inner die paddle surface, the inner lead surfaces, and the inner package body surface of the inner package are exposed in and substantially flush with a common exterior surface of the package body.

6. The semiconductor package of claim 5 wherein:
   the package body defines a side surface which extends in non-parallel relation to the exterior surface thereof; and
   at least some of the leads protrude from the side surface of the package body.

7. The semiconductor package of claim 1 wherein four inner packages are attached to the semiconductor die.

8. A semiconductor package, comprising:
   a die paddle;
   a plurality of leads extending at least partially about the die paddle in spaced relation thereto;
   a semiconductor die attached to the die paddle and electrically connected to at least some of the leads;
   at least one inner package attached to the semiconductor die, the inner package comprising:
      an inner die paddle having a generally planar inner die paddle surface;
      a plurality of inner leads extending at least partially about and in spaced relation to the inner die paddle, each of the leads having a generally planar inner lead surface;
      an inner semiconductor die attached to the inner die paddle and electrically connected to at least one of the inner leads; and
      an inner package body encapsulating the inner die paddle, the inner leads, and the inner semiconductor die such that the inner die paddle surface and the inner lead surface of each of the inner leads is exposed in and substantially flush with a generally planar inner package body surface of the inner package body;
   a package body encapsulating the die paddle, the leads, the semiconductor die and the inner package such that a portion of each of the leads is exposed in the package body.

9. The semiconductor package of claim 8 wherein the semiconductor die is electrically connected to the leads by conductive wires which are covered by the package body.

10. The semiconductor package of claim 8 wherein:
    the die paddle has a quadrangular configuration defining four peripheral edge segments; and
    the leads are segregated into four sets which extend along and in spaced relation to respective ones of the four peripheral edge segments of the die paddle.

11. The semiconductor package of claim 8 wherein conductive wires are used to electrically connect at least some of the inner leads of the inner package to at least one of the leads and to the semiconductor die.

12. The semiconductor package of claim 8 wherein four inner packages are attached to the semiconductor die.

13. The semiconductor package of claim 12 wherein conductive wires are used to electrically connect the semiconductor die to the leads, at least one of the inner leads of at least one of the inner packages to the semiconductor die, at least one of the inner leads of at least one of the inner packages to a respective one of the leads, and at least one of the inner leads of at least one of the inner packages to a respective one of the inner leads of another one of the inner packages.

14. A semiconductor package, comprising:
    a die paddle;
    a plurality of leads extending at least partially about the die paddle in spaced relation thereto;
    a semiconductor die attached to the die paddle and electrically connected to at least some of the leads;
    at least one inner package attached to the semiconductor die, the inner package comprising:
       an inner die paddle having a generally planar inner die paddle surface;

a plurality of inner leads extending at least partially about and in spaced relation to the inner die paddle, each of the inner leads having a generally planar inner lead surface;

an inner semiconductor die attached to the inner die paddle and electrically connected to at least one of the inner leads; and an inner package body encapsulating the inner die paddle, the inner leads, and the inner semiconductor die such that the inner die paddle surface and the inner leads surface of each of the leads is exposed and substantially flush with a generally planar inner package body surface of the inner package body, and each of the inner leads includes an exposed portion which protrudes from a side surface of the package body;

a package body encapsulating the die paddle, the leads, the semiconductor die and the inner package such that a portion of each of the leads is exposed in the package body.

15. The semiconductor package of claim 14 wherein the inner die paddle surface of the inner die paddle, the inner lead surface of each of the inner leads, and the inner package body surface of the inner package body are attached to the semiconductor die.

16. The semiconductor package of claim 15 wherein conductive wires are used to electrically connect the exposed portion of at least one of the inner leads to the semiconductor die and the exposed portion of at least one of the inner leads to a respective one of the leads.

17. The semiconductor package of claim 15 wherein four inner packages are attached to the semiconductor die.

18. The semiconductor package of claim 17 wherein conductive wires are used to electrically connect the semiconductor die to the leads, the exposed portion of at least one of the inner leads of at least one of the inner packages to the semiconductor die, the exposed portion of at least one of the inner leads of at least one of the inner packages to a respective one of the leads, and the exposed portion of at least one of the inner leads of at least one of the inner packages to the exposed portion of at least one of the inner leads of another one of the inner packages.

19. The semiconductor package of claim 8 wherein at least some of the leads protrude from a side surface of the package body.

* * * * *